(12) United States Patent
Kang et al.

(10) Patent No.: US 12,236,894 B2
(45) Date of Patent: *Feb. 25, 2025

(54) STAGE AND SCAN DRIVER USING THE SAME

(71) Applicant: SAMSUNG DISPLAY CO., LTD., Yongin-si (KR)

(72) Inventors: Chul Kyu Kang, Yongin-si (KR); Yong Sung Park, Yongin-si (KR); Jin Woo Park, Yongin-si (KR); Dong Sun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,290

(22) Filed: Aug. 21, 2023

(65) Prior Publication Data

US 2023/0395032 A1 Dec. 7, 2023

Related U.S. Application Data

(63) Continuation of application No. 15/979,099, filed on May 14, 2018, now Pat. No. 11,735,117.

(30) Foreign Application Priority Data

May 15, 2017 (KR) .................. 10-2017-0060116

(51) Int. Cl.
*G09G 3/3266* (2016.01)
*G09G 3/3291* (2016.01)
*G11C 19/28* (2006.01)

(52) U.S. Cl.
CPC ......... *G09G 3/3266* (2013.01); *G09G 3/3291* (2013.01); *G11C 19/28* (2013.01);
(Continued)

(58) Field of Classification Search
CPC ............... G09G 3/3266; G09G 3/3291; G09G 2310/0286; G09G 2310/0202; G11C 19/28
See application file for complete search history.

(56) References Cited

U.S. PATENT DOCUMENTS 9,548,026 B2 1/2017 Jang
2007/0063950 A1* 3/2007 Shin ..................... G11C 19/184
345/92

(Continued)

FOREIGN PATENT DOCUMENTS

KR 10-2014-0025149 3/2014
KR 20140055444 A 5/2014
KR 20150025539 A 3/2015

(Continued)

OTHER PUBLICATIONS

Korean Notice of Allowance for Application No. 10-2017-0060116, dated Jan. 4, 2023, 3 pages.

*Primary Examiner* — Roberto W Flores
(74) *Attorney, Agent, or Firm* — Lewis Roca Rothgerber Christie LLP

(57) ABSTRACT

A circuit stage including a first transistor including a first electrode and a gate electrode, the first electrode being coupled to a first input terminal and the gate electrode being coupled to a second input terminal configured to receive a first clock signal, an output circuit coupled to the second input terminal and a second power input terminal, an input circuit coupled to a second electrode of the first transistor and to a third input terminal, the third input terminal being configured to receive a first control clock signal, the input circuit being configured to control voltages of the second node and a third node, a first driving circuit coupled to a first power input terminal and to a fourth input terminal configured to receive a second control clock signal, and a second (Continued)

driving circuit coupled to the fourth input terminal and the third node.

20 Claims, 10 Drawing Sheets

(52) U.S. Cl.
CPC .............. *G09G 2310/0202* (2013.01); *G09G 2310/0286* (2013.01)

(56) References Cited

U.S. PATENT DOCUMENTS

| | | |
|---|---|---|
| 2009/0304139 A1* | 12/2009 | Tsai ................. G11C 19/28 377/79 |
| 2010/0039423 A1 | 2/2010 | Jeong et al. |
| 2010/0177087 A1 | 7/2010 | Han |
| 2012/0050234 A1 | 3/2012 | Jang et al. |
| 2014/0055444 A1 | 2/2014 | Jang |
| 2015/0279480 A1 | 10/2015 | Murakami et al. |
| 2017/0004775 A1 | 1/2017 | Chen et al. |
| 2017/0345366 A1 | 11/2017 | Jang |
| 2018/0293952 A1* | 10/2018 | He ................... H03K 17/284 |
| 2018/0308408 A1* | 10/2018 | Chen ................. G11C 19/28 |

FOREIGN PATENT DOCUMENTS

| | | |
|---|---|---|
| KR | 10-2016-0077315 | 7/2016 |
| KR | 20160103616 A | 9/2016 |
| KR | 20170026760 A | 3/2017 |
| KR | 10-2017-0133578 | 12/2017 |

* cited by examiner

STAGE AND SCAN DRIVER USING THE SAME

CROSS-REFERENCE TO RELATED APPLICATIONS

This application is a continuation of U.S. patent application Ser. No. 15/979,099, filed May 14, 2018, which claims priority to and the benefit of Korean Patent Application No. 10-2017-0060116, filed May 15, 2017, the entire content of both of which is incorporated herein by reference.

BACKGROUND

1. Field

Aspects of embodiments of the present disclosure relate to a circuit stage and a scan driver using the circuit stage.

2. Description of the Related Art

With the development of information technology, the importance of display devices that function as connection media between users and information has become ever more apparent. Accordingly, the use of various display devices, such as a liquid crystal display (LCD) device and an organic light-emitting display device, has increased.

Generally, a display device includes a data driver for supplying data signals to data lines, a scan driver for supplying scan signals to scan lines, and a display unit including pixels disposed in regions partitioned by the scan lines and the data lines.

The pixels included in the display unit are selected when scan signals are supplied to the scan lines and are then supplied with data signals from the data lines. The pixels supplied with the data signals supply light having luminance corresponding to the data signals to the outside of the display unit.

The scan driver includes circuit stages coupled to the scan lines. The circuit stages supply the scan signals to scan lines coupled thereto in accordance with signals from a timing controller.

On the other hand, pixels included in an organic light-emitting display device may be implemented using N-type transistors (e.g., NMOS transistors) and P-type transistors (e.g., PMOS transistors) to minimize or reduce leakage current. However, when circuit stages are implemented using N-type transistors, it is difficult to secure the reliability of driving. Therefore, there are circuit stages that are implemented using P-type transistors and are configured to supply high-level scan signals.

SUMMARY

Aspects of embodiments of the present disclosure are directed to a circuit stage for supplying a high-level scan signal and a scan driver using the circuit stage.

According to some embodiments of the present disclosure there is provided a circuit stage including: a first transistor including a first electrode and a gate electrode, the first electrode being coupled to a first input terminal and the gate electrode being coupled to a second input terminal configured to receive a first clock signal; an output circuit coupled to the second input terminal and a second power input terminal, and configured to supply a scan signal to an output terminal in accordance with voltages of a first node and a second node; an input circuit coupled to a second electrode of the first transistor and to a third input terminal, the third input terminal being configured to receive a first control clock signal, the input circuit being configured to control voltages of the second node and a third node; a first driving circuit coupled to a first power input terminal and to a fourth input terminal configured to receive a second control clock signal, the first driving circuit being configured to control the voltage of the second node; and a second driving circuit coupled to the fourth input terminal and the third node, and configured to control the voltage of the first node.

In some embodiments, transistors of the output circuit, the input circuit, the first driving circuit, and the second driving circuit, and the first transistor are P-type transistors.

In some embodiments, the first power input terminal is configured to receive a first power voltage set to a gate-off voltage, and the second power input terminal is configured to receive a second power voltage set to a gate-on voltage.

In some embodiments, the first input terminal is configured to receive either an output signal from a previous circuit stage or a gate start pulse.

In some embodiments, the first control clock signal and the second control clock signal have an identical cycle period, and are configured such that, in one cycle period, a high voltage supply period is longer than a low voltage supply period and such that the second control clock signal is shifted by ½ cycle period from the first control clock signal.

In some embodiments, the first clock signal has a cycle period longer than that of the first control clock signal, and is configured such that, in one cycle period, a high voltage supply period is shorter than a low voltage supply period.

In some embodiments, a high voltage supply period of the first clock signal overlaps low voltage supply periods of the first control clock signal and the second control clock signal.

In some embodiments, the input circuit includes: a second transistor coupled between the second electrode of the first transistor and the second node, a gate electrode of the second transistor being coupled to the third input terminal; a third transistor coupled between the third node and the third input terminal, a gate electrode of the third transistor being coupled to the second node; and a fourth transistor coupled between the third node and the second power input terminal, a gate electrode of the fourth transistor being coupled to the third input terminal.

In some embodiments, the first driving circuit includes: a fifth transistor coupled between a fourth node and the fourth input terminal, a gate electrode of the fifth transistor being coupled to the second node; a sixth transistor coupled between the first power input terminal and the fourth node, a gate electrode of the sixth transistor being coupled to the third node; and a first capacitor coupled between the second node and the fourth node.

In some embodiments, the first driving circuit includes: a first capacitor coupled between the second node and the fourth input terminal; and a fifth transistor and a sixth transistor coupled in series between the second node and the first power input terminal, wherein a gate electrode of the fifth transistor is coupled to the fourth input terminal, and a gate electrode of the sixth transistor is coupled to the third node.

In some embodiments, the second driving circuit includes: a second capacitor including a first terminal coupled to the third node; a seventh transistor coupled between a second terminal of the second capacitor and the fourth input terminal, a gate electrode of the seventh transistor being coupled to the third node; and an eighth transistor coupled between the second terminal of the second capacitor and the first node, a gate electrode of the eighth transistor being coupled to the fourth input terminal.

In some embodiments, the output circuit includes: a ninth transistor coupled between the second input terminal and the first node, a gate electrode of the ninth transistor being coupled to the second node; a tenth transistor coupled between the second input terminal and the output terminal, a gate electrode of the tenth transistor being coupled to the first node; an eleventh transistor coupled between the output terminal and the second power input terminal, a gate electrode of the eleventh transistor being coupled to the second node; and a third capacitor coupled between the second input terminal and the first node.

According to some embodiments of the present disclosure there is provided a scan driver including: a plurality of circuit stages configured to supply high-voltage scan signals to scan lines, wherein each of the circuit stages includes: a first transistor including a first electrode and a gate electrode, the first electrode being coupled to a first input terminal configured to receive either an output signal from a previous circuit stage or a gate start pulse, the gate electrode being coupled to a second input terminal configured to receive a clock signal; an output circuit coupled to the second input terminal and to a second power input terminal configured to receive a second power voltage, the output circuit being configured to supply a scan signal to an output terminal in accordance with voltages of a first node and a second node; an input circuit coupled to a second electrode of the first transistor and to a third input terminal configured to receive a first control clock signal, the input circuit being configured to control voltages of the second node and a third node; a first driving circuit coupled to a first power input terminal configured to receive a first power voltage set to a voltage higher than that of the second power voltage, the first driving circuit being coupled to a fourth input terminal configured to receive a second control clock signal, the first driving circuit being configured to control the voltage of the second node; and a second driving circuit coupled to the fourth input terminal and the third node, and configured to control the voltage of the first node.

In some embodiments, transistors of the output circuit, the input circuit, the first driving circuit, and the second driving circuit, and the first transistor are P-type transistors.

In some embodiments, second input terminals of j-th circuit stages (where j is 1, 5, 9, . . . ) are configured to receive a first clock signal, second input terminals of j+1-th circuit stages are configured to receive a second clock signal, second input terminals of j+2-th circuit stages configured to receive a third clock signal, and second input terminals of j+3-th circuit stages are configured to receive a fourth clock signal.

In some embodiments, the first to fourth clock signals have an identical cycle period, and are configured such that, in one cycle period, a high voltage supply period is shorter than a low voltage supply period.

In some embodiments, the first to fourth clock signals are sequentially supplied such that phases thereof are shifted by ¼ cycle period from each other.

In some embodiments, the first control clock signal and the second control clock signal have an identical cycle period, and are configured such that, in one cycle period, a high voltage supply period is longer than a low voltage supply period and such that the second control clock signal is shifted by ½ cycle period from the first control clock signal.

DETAILED DESCRIPTION

Figure 1:
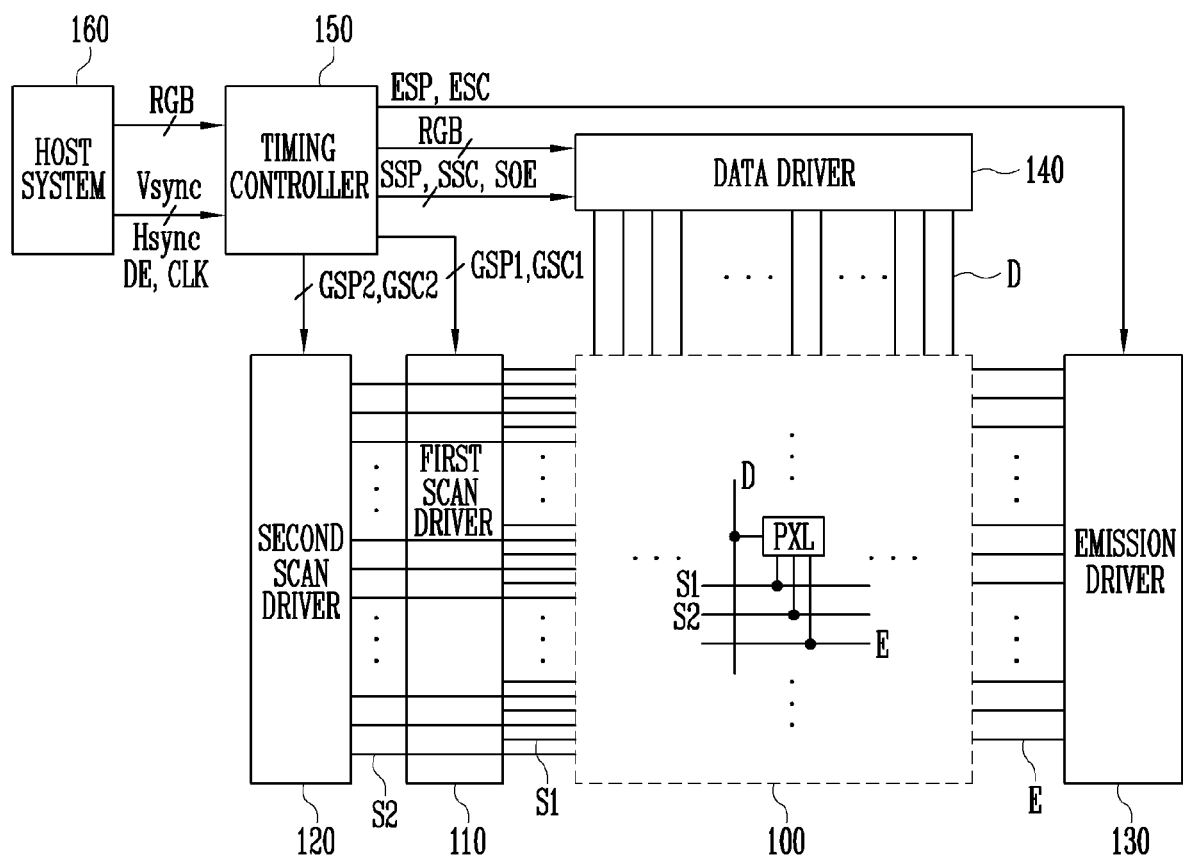
FIG. 1 is a diagram schematically illustrating an organic light-emitting display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

That is, it is noted that in this specification, the present disclosure is not limited to the following embodiments, but may be implemented in different forms. Further, it is also noted that the same reference numerals are used to designate the same or similar elements throughout the drawings.

FIG. 1 is a diagram schematically illustrating an organic light-emitting display device according to an embodiment of the present disclosure.

Referring to FIG. 1, the display device according to an embodiment of the present disclosure may include a display unit 100, a first scan driver 110, a second scan driver 120, an emission driver 130, a data driver 140, a timing controller 150, and a host system 160.

The display unit 100 includes a plurality of pixels PXL located to be coupled to data lines D, first scan lines S1, second scan lines S2, and emission control lines E. Each of the pixels PXL supplies light having a set or predetermined luminance to the outside of the display unit in accordance with the corresponding data signal.

For this operation, each pixel PXL has a plurality of transistors, including a driving transistor, and an organic light-emitting diode (OLED). The pixel PXL is supplied with a data signal from the corresponding data line D in accordance with a scan signal supplied to a first scan line S1 and/or a scan signal supplied to a second scan line S2. After the data signal has been supplied, the driving transistor supplies a current corresponding to the data signal to the OLED, and thus the OLED emits light having a set or predetermined luminance. The emission time of such a pixel PXL is controlled in response to emission control signals supplied through the emission control lines E.

Additionally, the pixel PXL includes an N-type transistor (e.g., NMOS transistor) and a P-type transistor (e.g., PMOS transistor). For example, the pixel PXL may be implemented using various suitable types of circuits so that it includes an N-type transistor and a P-type transistor.

The data driver 140 generates data signals using image data RGB inputted from the timing controller 150. The data signals generated by the data driver 140 are supplied to the data lines D. The data driver 140 may be implemented using various suitable types of currently known circuits.

The first scan driver 110 supplies scan signals to the first scan lines S1. For example, the first scan driver 110 may sequentially supply the scan signals to the first scan lines S1. When the scan signals are sequentially supplied through the first scan lines S1, N-type transistors included in respective pixels PXL are sequentially turned on in each horizontal line. For this operation, each scan signal supplied from the first scan driver 110 is set to a gate-on voltage (e.g., a high voltage) so that the N-type transistor may be turned on. The structure of the first scan driver 110 will be described in detail later.

The second scan driver 120 supplies scan signals to the second scan lines S2. For example, the second scan driver 120 may sequentially supply the scan signals to the second scan lines S2. When the scan signals are sequentially supplied through the second scan lines S2, P-type transistors included in respective pixels PXL are sequentially turned on in each horizontal line. For this operation, each scan signal supplied from the second scan driver 120 is set to a gate-on voltage (e.g., a low voltage) so that the P-type transistor may be turned on. The second scan driver 120 may be implemented using various suitable types of currently known circuits.

Additionally, when scan signals are sequentially supplied from the first scan driver 110 and/or the second scan driver 120, the pixels PXL are selected on a horizontal line basis, and the selected pixels PXL are supplied with data signals. The first scan driver 110 and/or the second scan driver 120 may be mounted on a panel. That is, the first scan driver 110 and/or the second scan driver 120 may be mounted on a substrate via a thin film process.

The emission driver 130 supplies emission control signals to the emission control lines E. For example, the emission driver 130 may sequentially supply the emission control signals to the emission control lines E. When the emission control signals are sequentially supplied, the pixels PXL are sequentially set to a non-light emission state. For this operation, the emission control signals may be set to a gate-off voltage so that transistors included in respective pixels PXL are turned off. The emission driver 130 may be implemented using various suitable types of currently known circuits.

The timing controller 150 may supply gate control signals to the scan drivers 110 and 120 based on timing signals, such as image data RGB, a vertical synchronization signal Vsync, a horizontal synchronization signal Hsync, a data enable signal DE, and a clock signal CLK, which are outputted from the host system 160, and may supply data control signals to the data driver 140. Further, the timing controller 150 may supply emission control signals to the emission driver 130.

The gate control signals include a first gate start pulse GSP1, one or more first gate shift clocks GSC1, a second gate start pulse GSP2, and one or more second gate shift clocks GSC2. Here, the first gate start pulse GSP1 and the first gate shift clocks GSC1 are supplied to the first scan driver 110, and the second gate start pulse GSP2 and the second gate shift clocks GSC2 are supplied to the second scan driver 120.

The first gate start pulse GSP1 controls the start timing of the scan signals supplied from the first scan driver 110. The first gate shift clocks GSC1 denote one or more clock signals for shifting the first gate start pulse GSP1.

The second gate start pulse GSP2 controls the start timing of the scan signals supplied from the second scan driver 120. The second gate shift clocks GSC2 denote one or more clock signals for shifting the second gate start pulse GSP2.

The emission control signals include an emission start pulse ESP and one or more emission shift clocks ESC. The emission start pulse ESP controls the start timing of the emission control signals. The emission shift clocks ESC denote one or more clock signals for shifting the emission start pulse ESP.

The data control signals include a source start pulse SSP, a source sampling clock SSC, a source output enable signal SOE, etc. The source start pulse SSP controls the data sampling start point of the data driver 140. The source sampling clock SSC controls the sampling operation of the data driver 140 based on a rising edge or a falling edge thereof. The source output enable signal SOE controls the output timing of the data driver 140.

The host system 160 supplies image data RGB to the timing controller 150 through an interface (e.g., a predetermined interface). Further, the host system 160 supplies the timing signals Vsync, Hsync, DE, and CLK to the timing controller 150.

Figure 2:
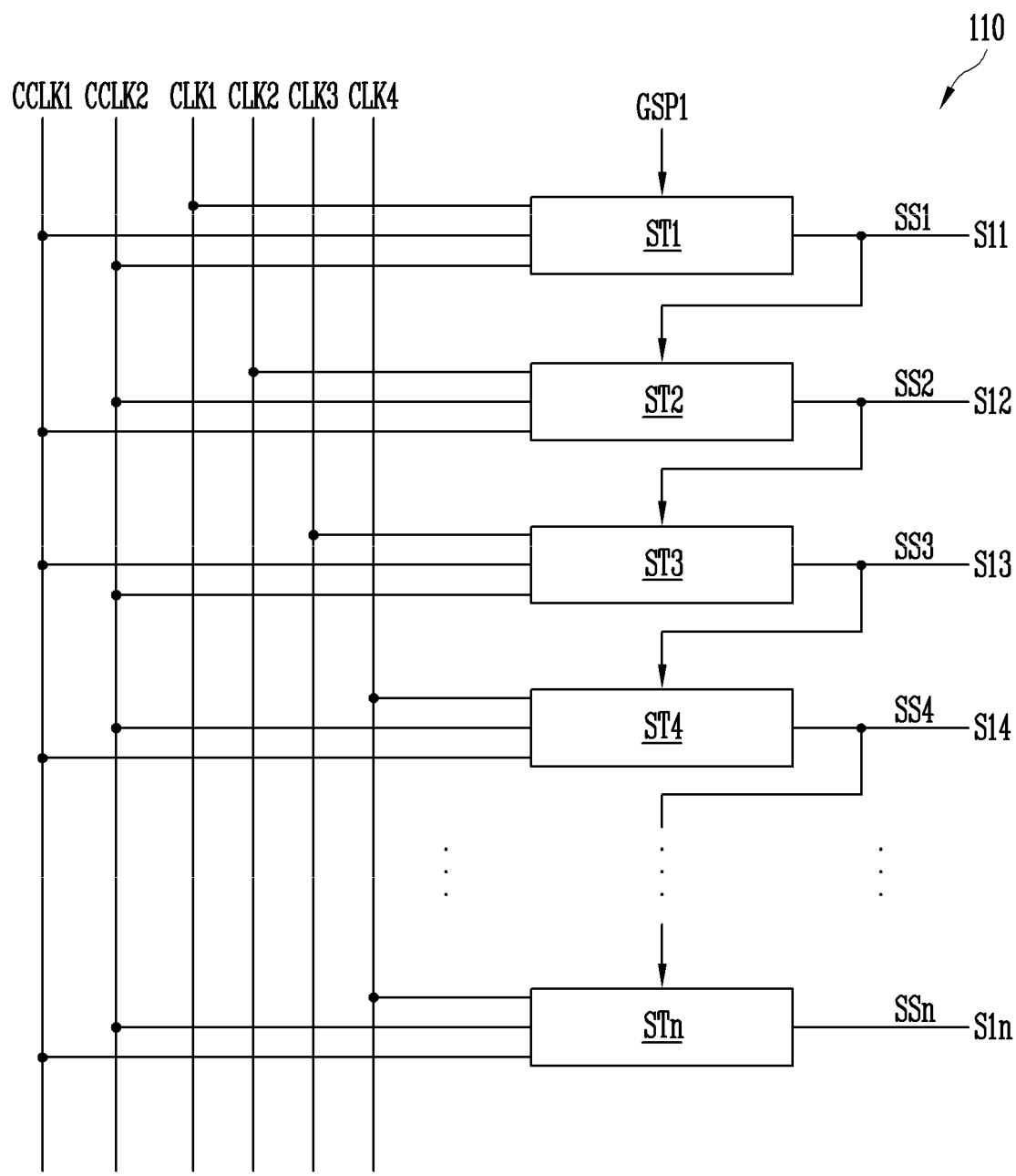
FIG. 2 is a diagram schematically illustrating a first scan driver illustrated in FIG. 1.

FIG. 2 is a diagram schematically illustrating the first scan driver illustrated in FIG. 1. In FIG. 2, it is assumed that n stages (e.g., circuit stages) ST (where n is a natural number of 2 or more) are included in the first scan driver 110.

Referring to FIG. 2, the first scan driver 110 according to an embodiment of the present disclosure includes a plurality of stages ST1 to STn. Each of the stages ST1 to STn is coupled to any one of first scan lines S11 to S1n, and supplies a scan signal SS to the corresponding one of the first scan lines S11 to S1n in accordance with a first gate start pulse GSP1. Here, an i-th stage STi (where i is a natural number) may supply a scan signal SSi to an i-th first scan line S1i.

The first stage ST1 supplies a scan signal SS1 to the first scan line S11 coupled thereto in accordance with the first gate start pulse GSP1. Each of the remaining stages ST2 to STn supplies a scan signal (e.g., any one of SS2 to SSn) to the first scan line (e.g., any one of S12 to S1n) coupled thereto in accordance with an output signal (i.e., a scan signal) supplied from a previous stage. For example, the i-th stage STi may supply a scan signal SSi to the i-th first scan line S1i in accordance with a scan signal SSi−1 supplied from an i−1-th stage STi−1.

The first gate shift clocks GSC1 include a first clock signal CLK1, a second clock signal CLK2, a third clock signal CLK3, a fourth clock signal CLK4, a first control clock signal CCLK1, and a second control clock signal CCLK2.

The first clock signal CLK1 to the fourth clock signal CLK4 are supplied to different stages ST. For example, the first clock signal CLK1 is supplied to j-th stages STj (where j is 1, 5, 9, . . . ), and the second clock signal CLK2 is supplied to j+1-th stages STj+1. Further, the third clock signal CLK3 is supplied to j+2-th stages STj+2, and the fourth clock signal CLK4 is supplied to j+3-th stages STj+3. The first clock signal CLK1 to the fourth clock signal CLK4 are supplied as scan signals SS to the first scan lines S11 to S1n.

The first control clock signal CCLK1 and the second clock signal CCLK2 are supplied to the stages ST1 to STn.

The first control clock signal CCLK1 and the second clock signal CCLK2 are used as control signals for controlling the operation of the stages ST1 to STn.

Figure 6:
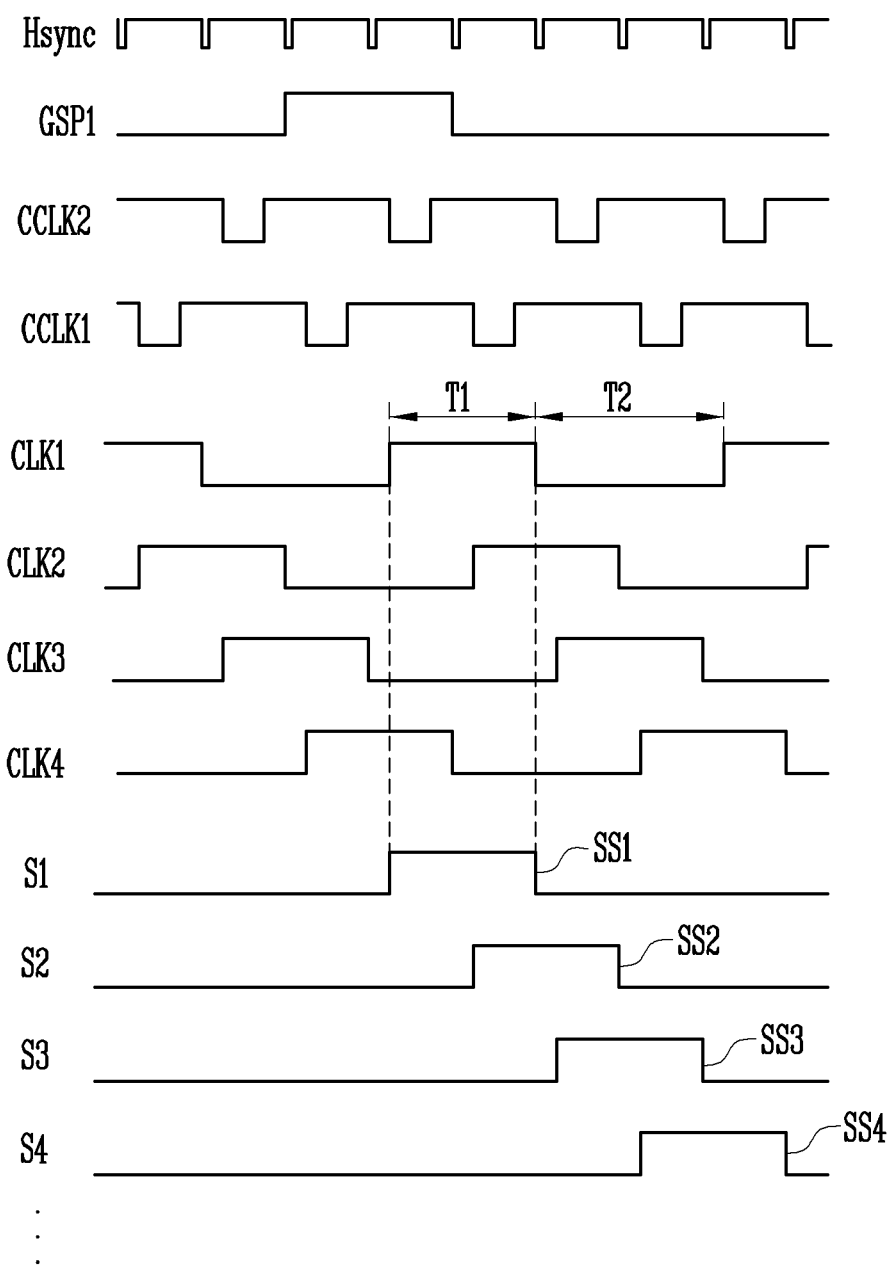

As illustrated in FIG. 6, the first clock signal CLK1 to the fourth clock signal CLK4 are set to square waves, each alternating between a high voltage and a low voltage. Here, in one cycle of each of the first clock signal CLK1 to the fourth clock signal CLK4, a high-voltage period T1 may be set to a period shorter than a low-voltage period T2. Here, the high-voltage period T1 corresponds to the width of a scan signal, and may be variously set, in any suitable manner known to a person of ordinary skill in the art, depending on the circuit structure of a pixel PXL.

The first clock signal CLK1 to the fourth clock signal CK4 are set to signals which have the same cycle (e.g., the same cycle period, such as 4H) and have phases shifted from each other. For example, the first clock signal CLK1 to the fourth clock signal CLK4 may be set such that each of the clock signals is shifted (e.g., shifted in time) by ¼ cycle (e.g., ¼ cycle period) from a previously supplied clock signal. In other words, when the first clock signal CLK1 to the fourth clock signal CLK4 are sequentially supplied, the second clock signal CLK2 is phase-shifted by ¼ cycle from the first clock signal CLK1, the third clock signal CLK3 is phase-shifted by ¼ cycle from the second clock signal CLK2, and the fourth clock signal CLK4 is shifted by ¼ cycle from the third clock signal CLK3.

Each of the first control clock signal CCLK1 and the second control clock signal CCLK2 is set to a square wave signal alternating between a high voltage and a low voltage. For example, the first control clock signal CCLK1 and the second control clock signal CCLK2 are set to signals which have the same cycle (e.g., 2H) and have phases shifted from each other. Here, the second control clock signal CCLK2 may be set such that the phase thereof is shifted by ½ cycle (e.g., ½ cycle period) from the first control clock signal CCLK1. Further, in one cycle (e.g., in one cycle period) of each of the first control clock signal CCLK1 and the second control clock signal CCLK2, a high-voltage period may be set to a period longer than a low-voltage period.

Additionally, the widths of the clock signals CLK1, CLK2, CLK3, and CLK4 may be set such that the high-voltage period of each of the clock signals overlaps the low-voltage periods of the first control clock signal CCLK1 and the second control clock signal CCLK2.

Figure 3:
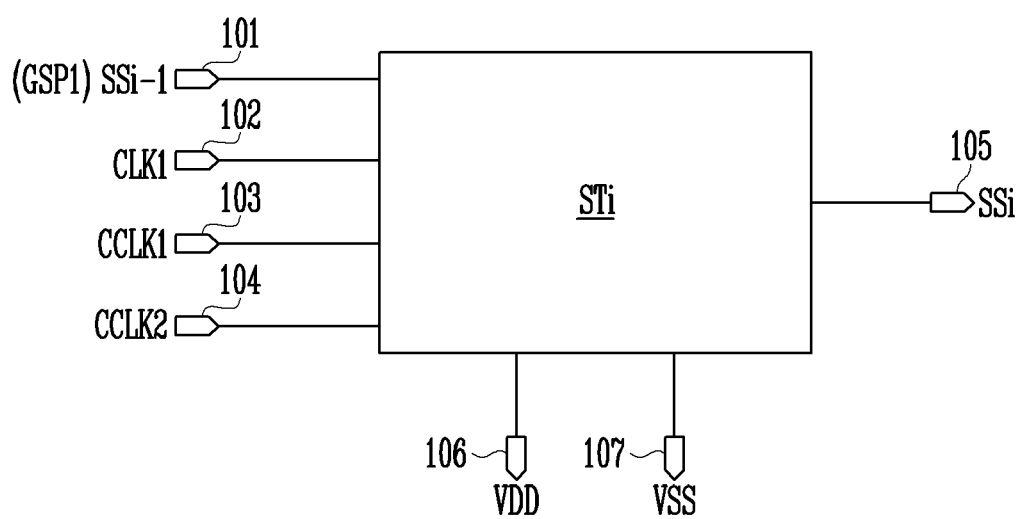
FIG. 3 is a diagram illustrating an example of coupling terminals of a circuit stage illustrated in FIG. 2.

FIG. 3 is a diagram illustrating an example of coupling terminals of the stage illustrated in FIG. 2. In FIG. 3, an i-th stage STi is illustrated for the convenience of description.

Referring to FIG. 3, the stage STi according to an embodiment of the present disclosure includes a first input terminal 101, a second input terminal 102, a third input terminal 103, a fourth input terminal 104, an output terminal 105, a first power input terminal 106, and a second power input terminal 107.

The first input terminal 101 is supplied with a scan signal SSi-1 from an i-1-th stage STi-1. Here, when the i-th stage STi is set to a first stage ST1, a first gate start pulse GSP1 is supplied through the first input terminal 101.

The second input terminal 102 is supplied with a first clock signal CLK1. The second input terminal 102 is electrically coupled to the output terminal 105 during at least a part of one frame period in accordance with the driving of the i-th stage STi. Here, a high voltage of the first clock signal CLK1 supplied through the second input terminal 102 is supplied as a scan signal SSi to the i-th first scan line S1i.

The third input terminal 103 is supplied with a first control clock signal CCLK1. In this case, a second control clock signal CCLK2 is supplied through the third input terminal 103 of the i-1-th stage STi-1.

The fourth input terminal 104 is supplied with the second control clock signal CCLK2. Here, the first control clock signal CCLK1 is supplied through the fourth input terminal 104 of the i-1-th stage STi-1.

The output terminal 105 outputs the scan signal SSi of the i-th stage STi. The scan signal SSi outputted through the output terminal 105 is supplied to the i-th first scan line S1i.

The first power input terminal 106 is coupled to first power VDD, and the second input terminal 107 is coupled to second power VSS. Here, the first power VDD is set to a gate-off voltage, and the second power VSS is set to a gate-on voltage. The gate-off voltage refers to a voltage that enables transistors included in the i-th stage STi to be turned off, and the gate-on voltage refers to a voltage that enables the transistors included in the i-th stage STi to be turned on. For this operation, the first power VDD may be set to a voltage higher than that of the second power VSS.

Further, in the embodiment of the present disclosure, the high voltages of the clock signals CLK1 to CLK4, CCLK1, and CCLK2 may be set to gate-off voltages (e.g., VDD), and the low voltages thereof may be set to gate-on voltages (e.g., VSS).

Figure 4:
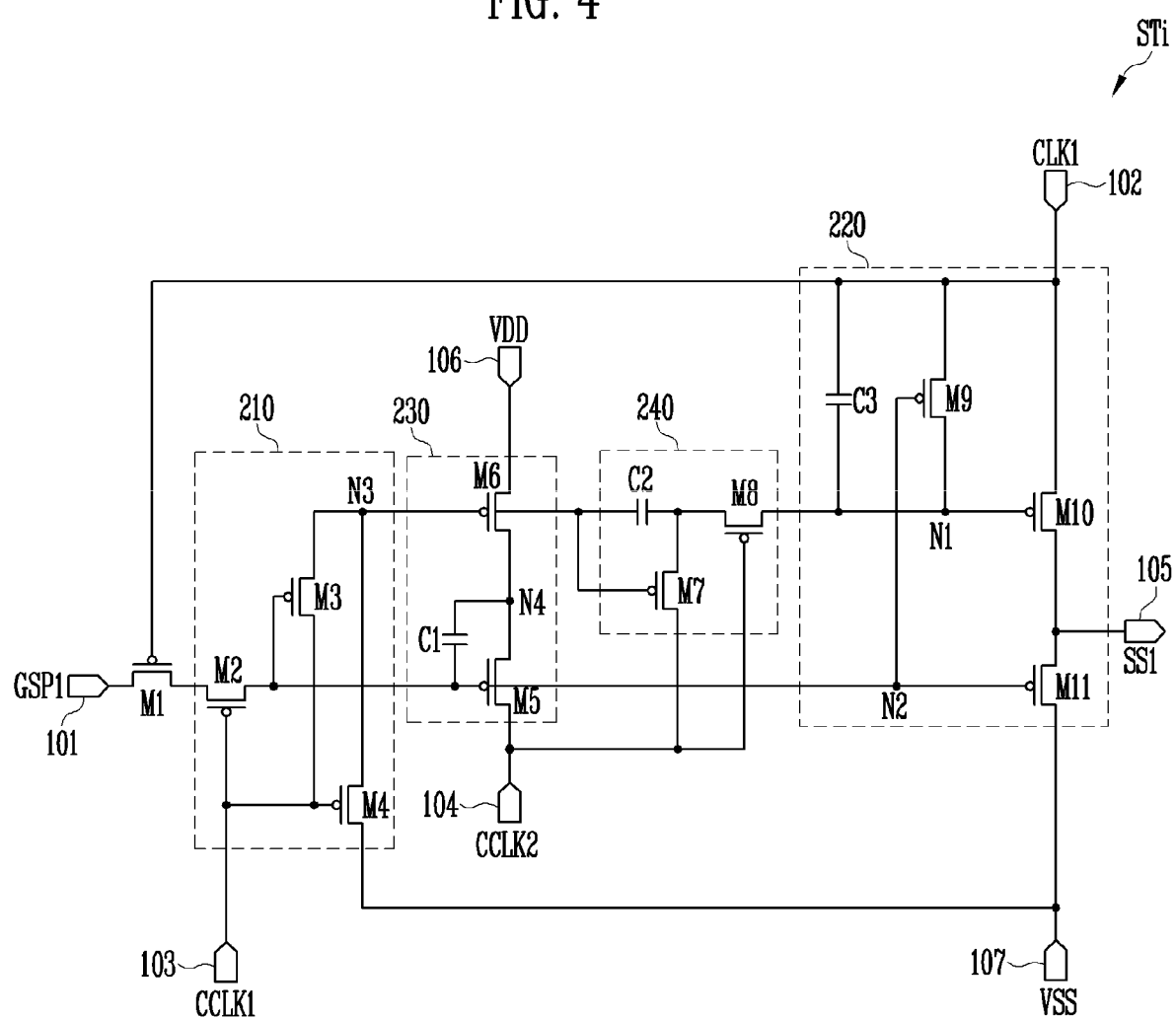
FIG. 4 is a circuit diagram illustrating an embodiment of the circuit stage illustrated in FIG. 3.

FIG. 4 is a circuit diagram illustrating an embodiment of the circuit stage illustrated in FIG. 3. Hereinafter, for the convenience of description, it is assumed that the supply of the control clock signals CCLK1 and CCLK2 means that a gate-on voltage (e.g., a low voltage) is supplied, and that the non-supply of the control clock signals CCLK1 and CCLK2 means that a gate-off voltage (e.g., a high voltage) is supplied. Also, it is assumed that the supply of the clock signal CLK1 means that a gate-off voltage (e.g., a high voltage) is supplied, and the non-supply of the clock signal CLK1 means that a gate-on voltage (e.g., a low voltage) is supplied. Furthermore, for the convenience of description, the i-th stage STi is assumed to be a first stage ST1.

Referring to FIG. 4, the stage STi according to an embodiment of the present disclosure may include an input unit (e.g., an input circuit) 210, an output unit (e.g., an output circuit) 220, a first driving unit (e.g., a first driving circuit) 230, a second driving unit (e.g., a second driving circuit) 240, and a first transistor M1.

A first electrode of the first transistor M1 is coupled to a first input terminal 101, and a second electrode of the first transistor M1 is coupled to the input unit 210. Further, a gate electrode of the first transistor M1 is coupled to a second input terminal 102. The first transistor M1 is turned on when the first clock signal CLK1 is not supplied through the second input terminal 102, and thus electrically couples the first input terminal 101 to the input unit 210.

The first transistor M1 controls the corresponding scan signal so that scan signals outputted to the first scan lines S11 to Sin overlap each other in a set or predetermined period, as illustrated in FIG. 6. That is, the first transistor M1 is turned off when the first clock signal CLK1 is supplied through the second input terminal 102. When the first transistor M1 is turned off, the voltage of a second node N2 may be prevented or substantially prevented from decreasing due to the low voltage of the first input terminal 101 during a period in which the first clock signal CLK1 is supplied to the output terminal 105 (i.e., when the scan signal SS1 is outputted).

The output unit 220 is coupled to the second input terminal 102 and the second power input terminal 107, and controls the voltage of the output terminal 105 in response to voltages of the first node N1 and the second node N2. For example, the output unit 220 electrically couples the second input terminal 102 or the second power input terminal 107 to the output terminal 105 in accordance with the voltages of the first node N1 and the second node N2. For this operation, the output unit 220 may include a ninth transistor M9, a tenth transistor M10, an eleventh transistor M11, and a third capacitor C3.

The ninth transistor M9 is coupled between the second input terminal 102 and the first node N1. Further, a gate electrode of the ninth transistor M9 is coupled to the second node N2. The ninth transistor M9 is turned on or off in response to the voltage of the second node N2.

The tenth transistor M10 is coupled between the second input terminal 102 and the output terminal 105. Further, a gate electrode of the tenth transistor M10 is coupled to the first node N1. The tenth transistor M10 is turned on or off in response to the voltage of the first node N1. Here, when the tenth transistor M10 is turned on, the voltage (i.e., high voltage) of the first clock signal CLK1 supplied through the second input terminal 102 is outputted as a scan signal SS1.

The eleventh transistor M11 is coupled between the output terminal 105 and the second power input terminal 107. Further, a gate electrode of the eleventh transistor M11 is coupled to the second node N2. The eleventh transistor M11 is turned on or off in response to the voltage of the second node N2.

The third capacitor C3 is coupled between the second input terminal 102 and the first node N1. The third capacitor C3 stores the voltage of the first node N1.

When the voltage of the second node N2 is set to a low voltage, the ninth transistor M9 is set to a turn-on state. When the ninth transistor M9 is set to a turn-on state, the second input terminal 102 is electrically coupled to the first node N1, and thus the voltage of the first node N1 is set to the voltage of the second input terminal 102. Therefore, the ninth transistor M9 is set to a turn-on state, and the voltages of the gate electrode and the first electrode of the tenth transistor M10 are set to the same, and thus the tenth transistor M10 is set to a turn-off state.

The input unit 210 controls the voltages of the second node N2 and a third node N3 in accordance with the signal from the first input terminal 101 coupled via the first transistor M1 and the signal of the third input terminal 103. For this operation, the input unit 210 has a second transistor M2, a third transistor M3, and a fourth transistor M4.

The second transistor M2 is coupled between the second electrode of the first transistor M1 and the second node N2. Further, a gate electrode of the second transistor M2 is coupled to the third input terminal 103. The second transistor M2 is turned on when the first control clock signal CCLK1 is supplied through the third input terminal 103, and thus electrically couples the first transistor M1 to the second node N2.

The third transistor M3 is coupled between the third node N3 and the third input terminal 103. Further, a gate electrode of the third transistor M3 is coupled to the second node N2. The third transistor M3 is turned on or off in response to the voltage of the second node N2.

The fourth transistor M4 is coupled between the third node N3 and the second power input terminal 107. Further, a gate electrode of the fourth transistor M4 is coupled to the third input terminal 103. The fourth transistor M4 is turned on when the first control clock signal CCLK1 is supplied through the third input terminal 103, and thus supplies the voltage of the second power VSS to the third node N3.

The first driving unit 230 is coupled to the first power input terminal 106 and the fourth input terminal 104, and then controls the voltage of a fourth node N4 in response to the voltages of the second node N2 and the third node N3. For this operation, the first driving unit 230 includes a fifth transistor M5, a sixth transistor M6, and a first capacitor C1.

The fifth transistor M5 is coupled between the fourth node N4 and the fourth input terminal 104. The fifth transistor M5 controls electrical coupling between the fourth node N4 and the fourth input terminal 104 while being turned on or off in response to the voltage of the second node N2.

The sixth transistor M6 is coupled between the first power input terminal 106 and the fourth node N4. The sixth transistor M6 controls electrical coupling between the first power input terminal 106 and the fourth node N4 while being turned on or off in response to the voltage of the third node N3.

The first capacitor C1 is coupled between the fourth node N4 and the second node N2. The third capacitor C1 stores a voltage corresponding to the second node N2.

Figure 5:
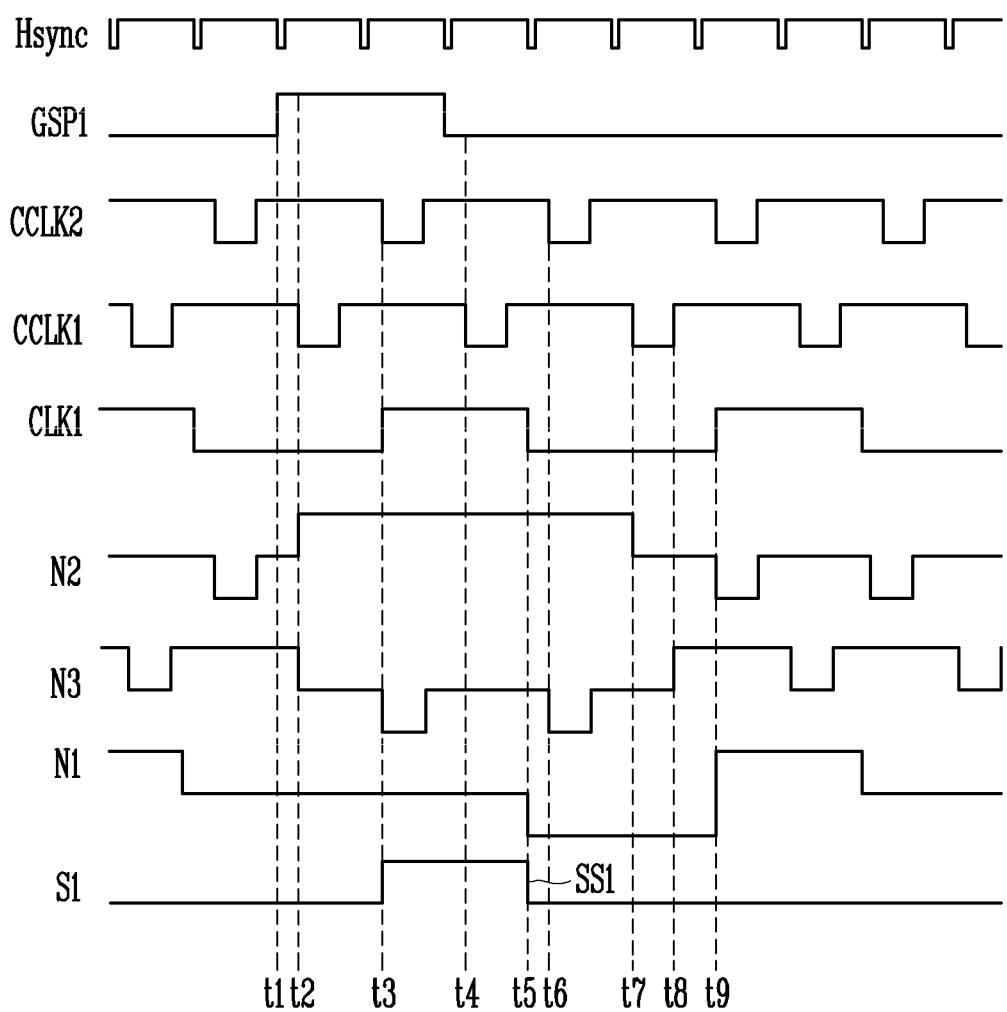
FIGS. 5 and 6 are waveform diagrams illustrating an embodiment of a method of driving the circuit stage illustrated in FIG. 4.

The fourth node N4 included in the first driving unit 230 is periodically supplied with the second control clock signal CCLK2 from the fourth input terminal 104 when the voltage of the second node N2 is set to a low voltage. When the second control clock signal CCLK2 is supplied to the fourth node N4, the voltage of the second node N2 periodically decreases to a voltage lower than a low voltage (e.g., VSS) due to the coupling of the first capacitor C1, as illustrated in FIG. 5. In this way, when the voltage of the second node N2 periodically decreases, the driving characteristics of the transistors M3, M5, M9, and M11 coupled to the second node N2 may be improved (when a low voltage is periodically applied to the gate electrode of a PMOS transistor, driving characteristics may be improved).

Further, when the voltage of the third node N3 is set to a low voltage, the first driving unit 230 supplies the voltage of the first power VDD to the fourth node N4. When the voltage of the first power VDD is supplied to the fourth node N4, the voltage of the second node N2 may be stably maintained due to the coupling of the first capacitor C1.

The second driving unit 240 is coupled to the third node N3, and controls the voltage of the first node N1 in response to the second control clock signal CCLK2 supplied through the fourth input terminal 104. For this operation, the second driving unit 240 includes a seventh transistor M7, an eighth transistor M8, and a second capacitor C2.

A first terminal of the second capacitor C2 is coupled to the third node N3, and a second terminal of the second capacitor C2 is coupled to the eighth transistor M8.

The seventh transistor M7 is coupled between the second terminal of the second capacitor C2 and the fourth input terminal 104. Further, a gate electrode of the seventh transistor M7 is coupled to the third node N3. The seventh transistor M7 is turned on or off in response to the voltage of the third node N3.

The eighth transistor M8 is coupled between the second terminal of the second capacitor C2 and the first node N1. Further, a gate electrode of the eighth transistor M8 is coupled to the fourth input terminal 104. The eighth transistor M8 is turned on when the second control clock signal CCLK2 is supplied through the fourth input terminal 104, and thus electrically couples the second terminal of the second capacitor C2 to the first node N1.

Further, the above-described first to eleventh transistors M1 to M11 are implemented as P-type transistors. That is, the stage ST according to the present disclosure is implemented using P-type transistors, and supplies a high voltage as a scan signal SS.

FIG. 5 is a waveform diagram illustrating an embodiment of a method of driving the stage illustrated in FIG. 4.

Referring to FIG. 5, when a first gate start pulse GSP1 is supplied, the voltage of the first input terminal 101 may be set to the voltage of first power VDD, whereas when the first gate start pulse GSP1 is not supplied, the voltage of the first input terminal 101 may be set to the voltage of second power VSS.

Further, the first gate start pulse GSP1 supplied through the first input terminal 101 is designated to overlap a signal (i.e., a first control clock signal CCLK1) supplied through the third input terminal 103 at least once.

In an operating process thereof, the first gate start pulse GSP1 is first supplied through the first input terminal 101 at first time point t1. Here, because the transistor M1 is set to a turn-on state, the first gate start pulse GSP1 supplied through the first input terminal 101 is supplied to the second transistor M2.

At second time point t2, the first control clock signal CCLK1 is supplied through the third input terminal 103. When the first control clock signal CCLK1 is supplied through the third input terminal 103, the second transistor M2 and the fourth transistor M4 are turned on.

When the second transistor M2 is turned on, the first input terminal 101 is electrically coupled to the second node N2. Then, the voltage of the second node N2 is set to a high voltage in accordance with the first gate start pulse GSP1 supplied through the first input terminal 101. When the voltage of the second node N2 is set to the high voltage, the third transistor M3, the fifth transistor M5, the ninth transistor M9, and the eleventh transistor M11 are turned off.

When the fourth transistor M4 is turned on, the voltage of the second power VSS is supplied to the third node N3. When the voltage of the second power VSS is supplied to the third node N3, the sixth transistor M6 and the seventh transistor M7 are turned on.

When the sixth transistor M6 is turned on, the voltage of the first power VDD is supplied to the fourth node N4. When the voltage of the first power VDD is supplied to the fourth node N4, the voltage of the second node N2 may be stably maintained due to the coupling of the first capacitor C1.

When the seventh transistor M7 is turned on, the second terminal of the second capacitor C2 is electrically coupled to the fourth input terminal 104. Here, because the eighth transistor M8 is set to a turn-off state, the first node N1 is maintained at a voltage of a previous period.

At third time point t3, the first clock signal CLK1 is supplied through the second input terminal 102, and the second control clock signal CCLK2 is supplied through the fourth input terminal 104.

When the second control clock signal CCLK2 is supplied through the fourth input terminal 104, the second control clock signal CCLK2 is supplied to the second terminal of the second capacitor C2 via the seventh transistor M7. Then, the voltage of the third node N3 decreases to a voltage lower than that of the second power VSS due to the coupling of the second capacitor C2. When the voltage of the third node N3 decreases, the seventh transistor M7 may stably remain turned on while driving characteristics are improved.

Further, when the second control clock signal CCLK2 is supplied through the fourth input terminal 104, the eighth transistor M8 is turned on. When the eighth transistor M8 is turned on, the second control clock signal CCLK2 is supplied to the first node N1. In this case, the voltage of the first node N1 is set to a low voltage, and thus the tenth transistor M10 is turned on (here, the ninth transistor M9 remains turned off due to the voltage of the second node N2).

When the tenth transistor M10 is turned on, the first clock signal CLK1 supplied through the second input terminal 102 is supplied to the output terminal 105. The first clock signal CLK1 supplied to the output terminal 105 is supplied as a scan signal SS1 to a 1st, first scan line S1.

Additionally, the first transistor M1 is turned off when the first clock signal CLK1 is supplied through the second input terminal 102. When the first transistor M1 is turned off, the first input terminal 101 is electrically disconnected from the second transistor M2.

At fourth time point t4, the first control clock signal CCLK1 is supplied through the third input terminal 103. When the first control clock signal CCLK1 is supplied through the third input terminal 103, the second transistor M2 and the fourth transistor M4 are turned on. When the fourth transistor M4 is turned on, the voltage of the second power VSS is supplied to the third node N3.

When the second transistor M2 is turned on, the first transistor M1 is electrically coupled to the second node N2. Here, because the first transistor M1 is set to a turn-off state, the second node N2 may be stably maintained at a high voltage.

At fifth time point t5, the supply of the first clock signal CLK1 through the second input terminal 102 is stopped. When the supply of the first clock signal CLK1 is stopped, the voltage of the second input terminal 102 decreases from a high voltage to a low voltage. Then, the voltage of the first node N1 decreases due to the coupling of the third capacitor C3, and thus the tenth transistor M10 remains turned on. When the tenth transistor M10 remains turned on, a low voltage supplied through the second input terminal 102 is applied to the output terminal 105. That is, at fifth time point t5, the supply of the scan signal SS1 is stopped.

At sixth time point t6, the second control clock signal CCLK2 is supplied through the fourth input terminal 104. When the second control clock signal CCLK2 is supplied through the fourth input terminal 104, the second control clock signal CCLK2 is supplied to the second terminal of the second capacitor C2 via the seventh transistor M7. Then, the voltage of the third node N3 decreases to a voltage lower than that of the second power VSS due to the coupling of the second capacitor C2.

Further, when the second control clock signal CCLK2 is supplied through the fourth input terminal 104, the eighth transistor M8 is turned on. When the eighth transistor M8 is turned on, the second control clock signal CCLK2 is supplied to the first node N1. In this case, the first node N1 is maintained at a low voltage, and thus the tenth transistor M10 remains turned on.

At seventh time point t7, the first control clock signal CCLK1 is supplied through the third input terminal 103. When the first control clock signal CCLK1 is supplied through the third input terminal 103, the second transistor M2 and the fourth transistor M4 are turned on. When the fourth transistor M4 is turned on, the voltage of the second power VSS is supplied to the third node N3.

On the other hand, at seventh time point t7, the first clock signal CLK1 is not supplied through the second input terminal 102, and thus the first transistor M1 remains turned on. Therefore, when the second transistor M2 is turned on, a low voltage supplied through the first input terminal 101 is applied to the second node N2.

When the low voltage is applied to the second node N2, the third transistor M3, the fifth transistor M5, the ninth transistor M9, and the eleventh transistor M11 are turned on.

When the third transistor M3 is turned on, the voltage of the second power VSS from the third node N3 is supplied to the second node N2. That is, the second node N2 is maintained at a low voltage.

When the fifth transistor M5 is turned on, the fourth input terminal 104 is electrically coupled to the fourth node N4.

When the ninth transistor M9 is turned on, the first node N1 is electrically coupled to the second input terminal 102. Here, the voltage of the second input terminal 102 is set to a low voltage, and thus the voltage of the first node N1 is set to a low voltage.

When the eleventh transistor M11 is turned on, the voltage of the second power VSS is supplied to the output terminal 105.

At eighth time point t8, the supply of the first control clock signal CCLK1 through the third input terminal 103 is stopped. That is, the voltage of the third input terminal 103 increases from a low voltage to a high voltage. Here, because the third transistor M3 is set to a turn-on state, the voltage of the third node N3 increases to the high voltage. When the voltage of the third node N3 increases, the sixth transistor M6 and the seventh transistor M7 are turned off.

At ninth time point t9, the second control clock signal CCLK2 is supplied through the fourth input terminal 104, and the first clock signal CLK1 is supplied through the second input terminal 102.

When the second control clock signal CCLK2 is supplied through the fourth input terminal 104, the second control clock signal CCLK2 is applied to the fourth node N4. Then, the voltage of the second node N2 decreases due to the coupling of the first capacitor C1. That is, the voltage of the second node N2 decreases to a voltage lower than that of the second power VSS.

Further, because the ninth transistor M9 remains turned on at ninth time point t9, the first clock signal CLK1 supplied through the second input terminal 102 is applied to the first node N1, and thus the voltage of the first node N1 increases to a high voltage. When the voltage of the first node N1 is set to the high voltage, the tenth transistor M10 is turned off. Therefore, the output terminal 105 is maintained at the voltage of the second power VSS regardless of the first clock signal CLK1 supplied through the second input terminal 102.

The stage ST according to the present disclosure outputs a scan signal SS1 to the output terminal 105 while repeating the above-described procedure. Further, the second stage ST2 supplied with the scan signal from the output terminal 105 of the first stage ST1 also outputs a scan signal while repeating the above-described procedure. That is, as illustrated in FIG. 6, scan signals may be sequentially supplied to the scan lines S1 to S4.

Figure 7:
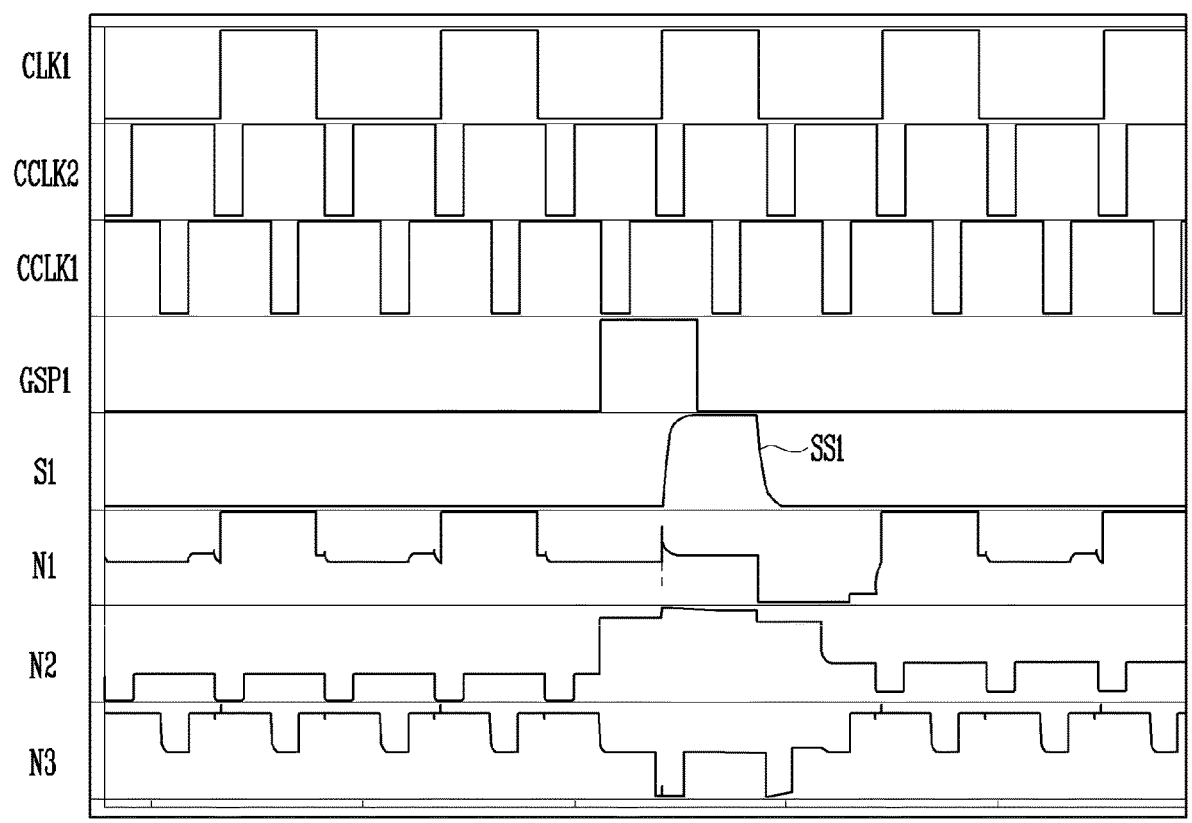
FIG. 7 is a waveform diagram illustrating the simulation results of a circuit stage according to an embodiment of the present disclosure.

FIG. 7 is a waveform diagram illustrating the simulation results of the stage according to an embodiment of the present disclosure. In FIG. 7, the stage is assumed to be a first stage ST1.

Referring to FIG. 7, the first stage ST1 of the present disclosure outputs a scan signal SS1 to a 1st, first scan line S1 in accordance with the first gate start pulse GSP1. That is, the first stage ST1 of the present disclosure may stably output the scan signal SS1 in accordance with the control clock signals CCLK1 and CCLK2 and the clock signal CLK1.

Figure 8:
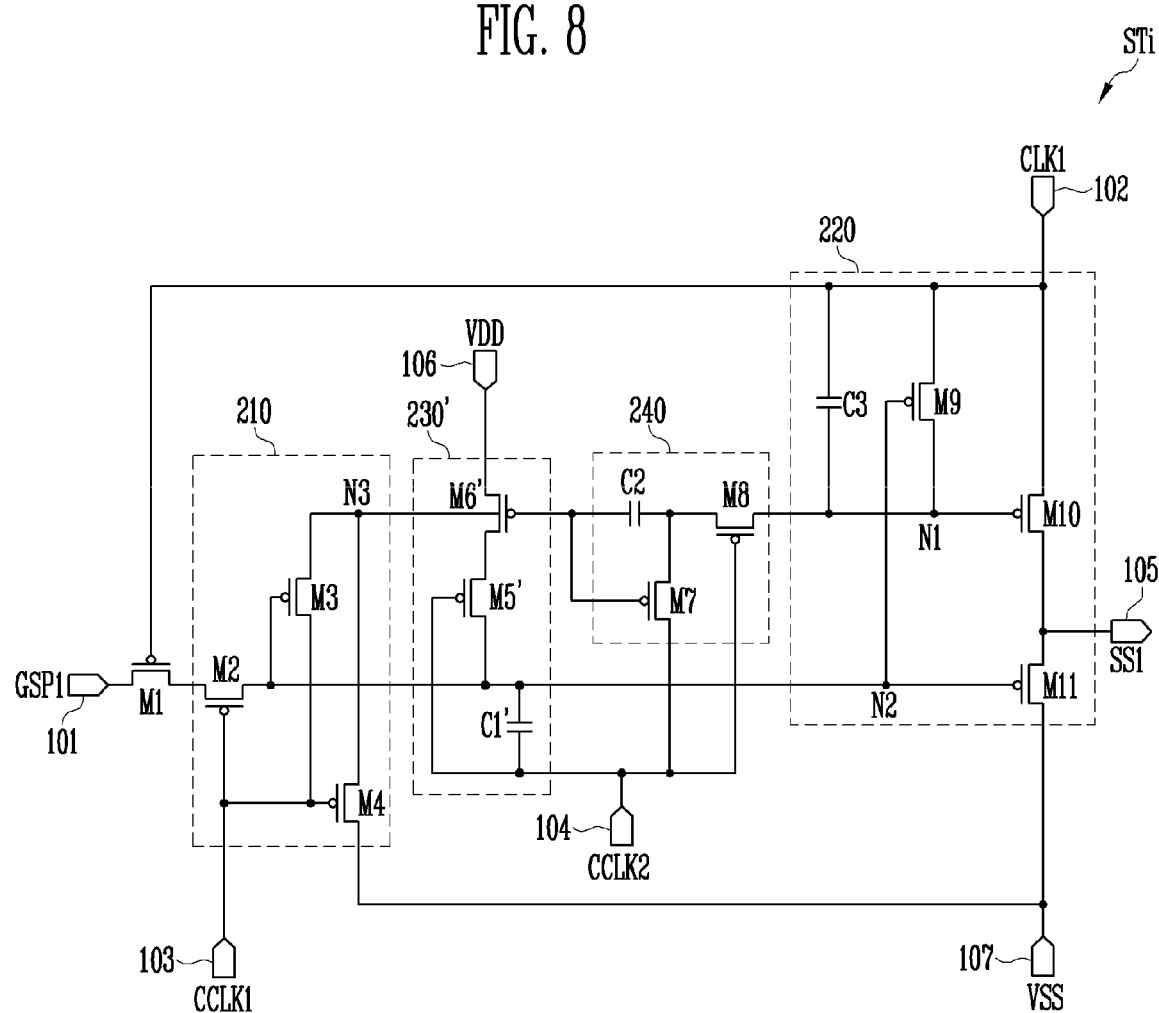
FIG. 8 is a circuit diagram illustrating an embodiment of the circuit stage illustrated in FIG. 3.

FIG. 8 is a circuit diagram illustrating an embodiment of the stage illustrated in FIG. 3. In the description of FIG. 8, the same reference numerals are allocated to designate components that are identical to or substantially identical to those of FIG. 4, and thus a detailed description thereof may not be repeated.

Referring to FIG. 8, a stage STi according to an embodiment of the present disclosure may include an input unit 210, an output unit 220, a first driving unit 230', a second driving unit 240, and a first transistor M1.

The first driving unit 230' is coupled to a first power input terminal 106 and a fourth input terminal 104, and controls the voltage of a second node N2 in response to the voltage of a third node N3. For this operation, the first driving unit 230' may include a fifth transistor M5', a sixth transistor M6', and a first capacitor C1'.

The fifth transistor M5' and the sixth transistor M6' are coupled in series between the second node N2 and the first power input terminal 106. Further, a gate electrode of the fifth transistor M5' is coupled to the fourth input terminal 104, and a gate electrode of the sixth transistor M6' is coupled to the third node N3.

The first capacitor C1' is coupled between the second node N2 and the fourth input terminal 104.

The first driving unit 230' is configured to control the voltage of the second node N2 in response to the second control clock signal CCLK2, and an actual operating process of the first driving unit 230' is similar to that of the first driving unit 230 illustrated in FIG. 4.

In detail, the first driving unit 230 illustrated in FIG. 4 periodically decreases the voltage of the second node N2 in response to the second control clock signal CCLK2 from the fourth input terminal 104 when the voltage of the second node N2 is set to a low voltage. Similarly, the first driving unit 230' illustrated in FIG. 8 also periodically decreases the voltage of the second node N2 whenever the second control clock signal CCLK2 is supplied due to the coupling of the first capacitor C1' when the voltage of the second node N2 is set to a low voltage.

Further, when the voltage of the third node N3 is set to a low voltage, the first driving unit 230 illustrated in FIG. 4 maintains the voltage of the second node N2 at the voltage of first power VDD. Similarly, the first driving unit 230' illustrated in FIG. 8 also supplies the voltage of the first power VDD to the second node N2 when the second control clock signal CCLK2 is supplied at the same time that the voltage of the third node N3 is set to a low voltage.

That is, the first driving unit 230' illustrated in FIG. 8 is operated in a way similar or identical to that of the first driving unit 230 illustrated in FIG. 4, and thus a detailed description thereof may not be repeated.

Figure 9:
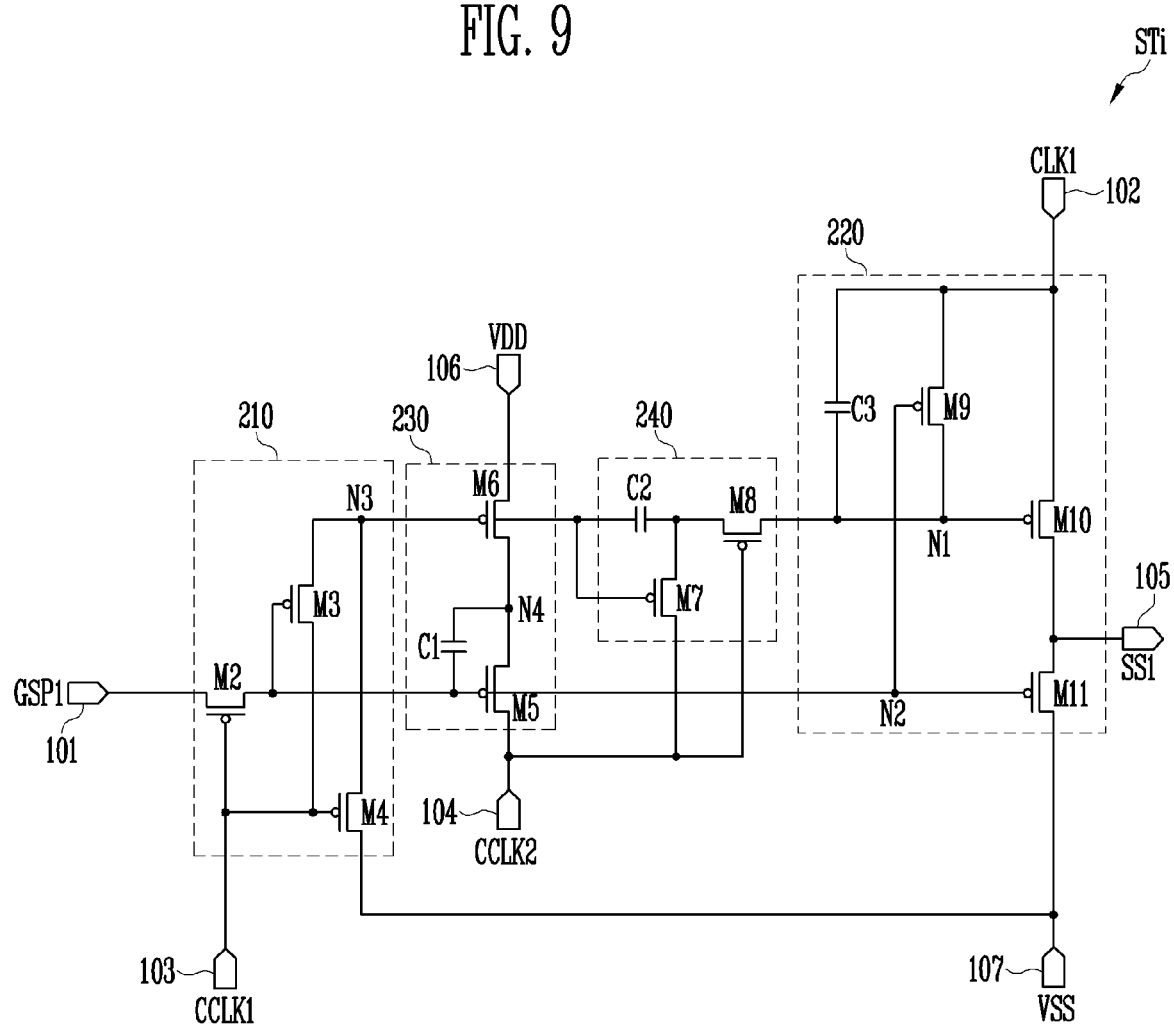
FIG. 9 is a circuit diagram illustrating an embodiment of the circuit stage illustrated in FIG. 3.

FIG. 9 is a circuit diagram illustrating an embodiment of the stage illustrated in FIG. 3. In the description of FIG. 9, the same reference numerals are allocated to components that are identical to or substantially identical to those of FIG. 4, and thus a detailed description thereof may not be repeated.

Referring to FIG. 9, a stage STi according to an embodiment of the present disclosure has the same configuration as the stage of FIG. 4, except that a first transistor M1 is removed.

Here, when the first transistor M1 is removed, the first input terminal 101 is always electrically coupled to a second transistor M2. Here, the present embodiment does not have a configuration in which scan signals are outputted to first scan lines S1 to overlap each other, as illustrated in FIG. 6.

Figure 10:
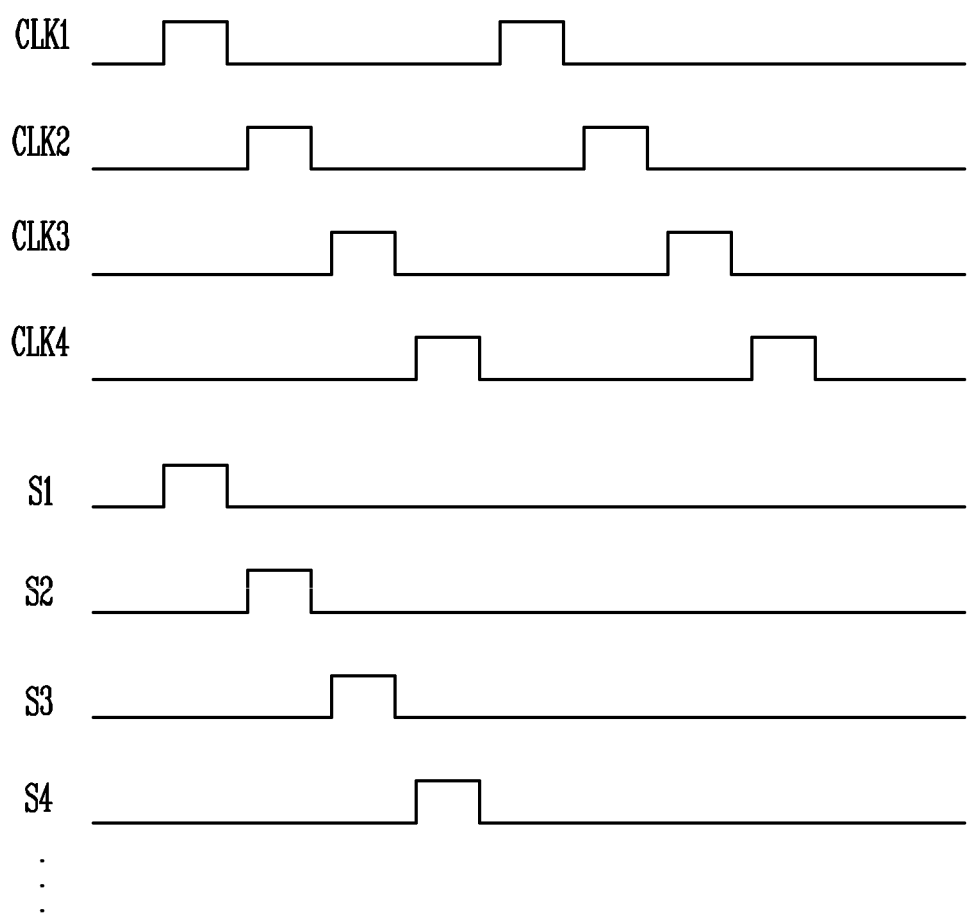
FIG. 10 is a waveform diagram schematically illustrating scan signals corresponding to the circuit stage of FIG. 9.

That is, in the embodiment of the present disclosure, first to fourth clock signals CLK1 to CLK4 are supplied not to overlap each other, as illustrated in FIG. 10. In this case, the scan signals that are supplied to the scan lines S1 do not overlap each other, either.

In accordance with a stage and a scan driver using the stage according to the embodiments of the present disclosure, high-level scan signals may be supplied using stages, each implemented using P-type transistors. Further, the embodiments of the present disclosure may freely control the width of scan signals by controlling the width of clock signals.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two elements, it can be the only element between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use," "using," and "used" may be considered synonymous with the terms "utilize," "utilizing," and "utilized," respectively.

Example embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as defined by the following claims, and equivalents thereof.

What is claimed is:

1. A display device comprising:
   a host system configured to output a timing signal including a clock signal;
   a timing controller configured to receive the timing signal and to output gate shift clocks including a first clock signal, a first control clock signal, and a second control clock signal;
   a scan driver configured to receive the gate shift clocks and to output scan signals; and
   a display unit comprising a plurality of pixels, wherein the scan signals are supplied to the plurality of pixels,
   wherein the scan driver comprises:
      a first transistor comprising a first electrode and a gate electrode, the first electrode being coupled to a first input terminal, and the gate electrode being coupled to a second input terminal and configured to receive the first clock signal;
      an output circuit coupled to the second input terminal and a second power input terminal, and configured to receive the first clock signal such that the output circuit and the gate electrode of the first transistor are both configured to receive the first clock signal, and the output circuit is configured to supply a scan signal to an output terminal in accordance with voltages of a first node and a second node;
      an input circuit coupled to a second electrode of the first transistor and to a third input terminal, the third input terminal being configured to receive the first control clock signal, the input circuit being configured to control voltages of the second node and a third node;
      a first driving circuit coupled to a first power input terminal and to a fourth input terminal configured to receive the second control clock signal, the first driving circuit being configured to control the voltage of the second node; and
      a second driving circuit coupled to the fourth input terminal and the third node, and configured to control the voltage of the first node, and
   wherein the first clock signal has a cycle period longer than that of the first control clock signal.

2. The display device according to claim 1, wherein each of the output circuit, the input circuit, the first driving circuit, and the second driving circuit comprises a P-type transistor, and
   wherein the first transistor is the P-type transistor.

3. The display device according to claim 1, wherein the first power input terminal is configured to receive a first power voltage set to a gate-off voltage, and the second power input terminal is configured to receive a second power voltage set to a gate-on voltage.

4. The display device according to claim 1, wherein the scan driver comprises circuit stages, wherein each of the circuit stages outputs one of the scan signals, and
   wherein the first input terminal of one of the circuit stages is configured to receive either a scan signal from a previous circuit stage or a gate start pulse.

5. The display device according to claim 1, wherein the first control clock signal and the second control clock signal have an identical cycle period.

6. The display device according to claim 5, wherein a high voltage supply period is longer than a low voltage supply period in one cycle period, and
wherein the second control clock signal is shifted by ½ cycle period from the first control clock signal.

7. The display device according to claim 1, wherein the first clock signal is configured such that, in one cycle period, a high voltage supply period is shorter than a low voltage supply period.

8. The display device according to claim 7, wherein a high voltage supply period of the first clock signal overlaps low voltage supply periods of the first control clock signal and the second control clock signal.

9. The display device according to claim 1, wherein the input circuit comprises:
a second transistor coupled between the second electrode of the first transistor and the second node, and comprising a gate electrode coupled to the third input terminal;
a third transistor coupled between the third node and the third input terminal, and comprising a gate electrode coupled to the second node; and
a fourth transistor coupled between the third node and the second power input terminal, and comprising a gate electrode coupled to the third input terminal.

10. The display device according to claim 1, wherein the first driving circuit comprises:
a fifth transistor coupled between a fourth node and the fourth input terminal, and comprising a gate electrode coupled to the second node;
a sixth transistor coupled between the first power input terminal and the fourth node, and comprising a gate electrode coupled to the third node; and
a first capacitor coupled between the second node and the fourth node.

11. The display device according to claim 1, wherein the first driving circuit comprises:
a first capacitor coupled between the second node and the fourth input terminal; and
a fifth transistor and a sixth transistor coupled in series between the second node and the first power input terminal,
wherein the fifth transistor comprises a gate electrode coupled to the fourth input terminal, and
wherein the sixth transistor comprises a gate electrode coupled to the third node.

12. The display device according to claim 1, wherein the second driving circuit comprises:
a second capacitor comprising a first terminal and a second terminal, wherein the first terminal of the second capacitor is coupled to the third node;
a seventh transistor coupled between the second terminal of the second capacitor and the fourth input terminal, and comprising a gate electrode coupled to the third node; and
an eighth transistor coupled between the second terminal of the second capacitor and the first node, and comprising a gate electrode coupled to the fourth input terminal.

13. The display device according to claim 1, wherein the output circuit comprises:
an eleventh transistor coupled between the output terminal and the second power input terminal, and comprising a gate electrode coupled to the second node; and
a third capacitor coupled between the second input terminal and the first node.

14. The display device according to claim 13, wherein the output circuit further comprises a ninth transistor coupled between the second input terminal and the first node, and comprising a gate electrode coupled to the second node.

15. The display device according to claim 14, wherein the second input terminal is configured to receive the first clock signal.

16. The display device according to claim 13, wherein the output circuit further comprises:
a tenth transistor coupled between the second input terminal and the output terminal, and comprising a gate electrode coupled to the first node.

17. The display device according to claim 1, wherein each of the scan signals is a high-voltage signal.

18. The display device according to claim 1, wherein the timing controller further outputs a second clock signal, a third clock signal, and a fourth clock signal,
wherein the scan driver comprises circuit stages, wherein the circuit stages output the scan signals,
wherein second input terminals of j-th circuit stages (where j is 1, 5, 9, . . . ) are configured to receive the first clock signal,
wherein second input terminals of j+1-th circuit stages are configured to receive the second clock signal,
wherein second input terminals of j+2-th circuit stages are configured to receive the third clock signal, and
wherein second input terminals of j+3-th circuit stages are configured to receive the fourth clock signal.

19. The display device according to claim 18, wherein the first to fourth clock signals have an identical cycle period, and are configured such that, in one cycle period, a high voltage supply period is shorter than a low voltage supply period.

20. The display device according to claim 19, wherein the timing controller sequentially outputs the first to fourth clock signals such that phases thereof are shifted by ¼ cycle period from each other.

* * * * *